(12) United States Patent
Minamida et al.

(10) Patent No.: US 10,373,849 B2
(45) Date of Patent: Aug. 6, 2019

(54) SUBSTRATE PROCESSING APPARATUS

(71) Applicant: Tokyo Electron Limited, Tokyo (JP)

(72) Inventors: Junya Minamida, Kumamoto (JP);
Masaru Oda, Kumamoto (JP); Sho Watanabe, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 23 days.

(21) Appl. No.: 15/681,603

(22) Filed: Aug. 21, 2017

(65) Prior Publication Data

US 2018/0061688 A1  Mar. 1, 2018

(30) Foreign Application Priority Data

Aug. 24, 2016 (JP) .................. 2016-163668

(51) Int. Cl.
*H01L 21/67* (2006.01)
*H01L 21/677* (2006.01)

(52) U.S. Cl.
CPC .. *H01L 21/67178* (2013.01); *H01L 21/67017* (2013.01); *H01L 21/6719* (2013.01); *H01L 21/67023* (2013.01); *H01L 21/67173* (2013.01); *H01L 21/67742* (2013.01)

(58) Field of Classification Search
CPC ......... H01L 21/67017; H01L 21/67023; H01L 21/67173; H01L 21/67178; H01L 21/6719; H01L 21/67742

USPC ......................... 134/84, 99.1, 902
See application file for complete search history.

(56) References Cited

U.S. PATENT DOCUMENTS

2012/0160279 A1* 6/2012 Konishi ............ H01L 21/67051
134/99.1

FOREIGN PATENT DOCUMENTS

JP  2012-142404 A  7/2012

* cited by examiner

Primary Examiner — Levon J Shahinian
(74) Attorney, Agent, or Firm — Abelman, Frayne & Schwab

(57) ABSTRACT

A substrate processing apparatus includes a plurality of processing units and a gas supply unit. The plurality of processing units are stacked and arranged, and each configured to hold a substrate in a chamber and to process the substrate by a processing liquid, and the gas supply unit is provided for each of the processing units to supply a gas into each of the processing units. The gas supply unit includes an intake unit and an air supply unit. The intake unit takes in and purifies outside air, and the air supply unit configured to supplies a clean air purified by the intake unit into the processing units. In addition, the intake unit is arranged on a lateral side of the chamber, and is arranged on the same side face of the chambers between the stacked and arranged processing units.

13 Claims, 15 Drawing Sheets

SUBSTRATE PROCESSING APPARATUS

CROSS-REFERENCE TO RELATED APPLICATION

This application is based on and claims priority from Japanese Patent Application No. 2016-163668 filed on Aug. 24, 2016 with the Japan Patent Office, the disclosure of which is incorporated herein in its entirety by reference.

TECHNICAL FIELD

An exemplary embodiment of the present disclosure relates to a substrate processing apparatus.

BACKGROUND

In the related art, there is known a substrate processing apparatus including a plurality of single wafer type processing units that supply a processing liquid onto the front surface or the front and rear surfaces of a substrate so as to process the substrate by the processing liquid while holding and rotating the substrate such as, for example, a semiconductor wafer, and a transfer device that performs the carry-in/out of the substrate with respect to the processing units.

Some substrate processing apparatuses have adopted a layout in which processing units are stacked in multiple stages in order to obtain higher throughput while suppressing an increase in the footprint of the apparatus (see, e.g., Japanese Patent Laid-open Publication No. 2012-142404).

SUMMARY

A substrate processing apparatus includes a plurality of processing units and a gas supply unit. The plurality of processing units are stacked and arranged, and each configured to hold a substrate in a chamber and to process the substrate by a processing liquid, and the gas supply unit is provided for each of the processing units to supply a gas into each of the processing units. The gas supply unit includes an intake unit and an air supply unit. The intake unit takes in and purifies outside air, and the air supply unit configured to supplies a clean air purified by the intake unit into the processing units. In addition, the intake unit is arranged on a lateral side of the chamber, and is arranged on the same side face of the chambers between the stacked and arranged processing units.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DETAILED DESCRIPTION

Figure 1:
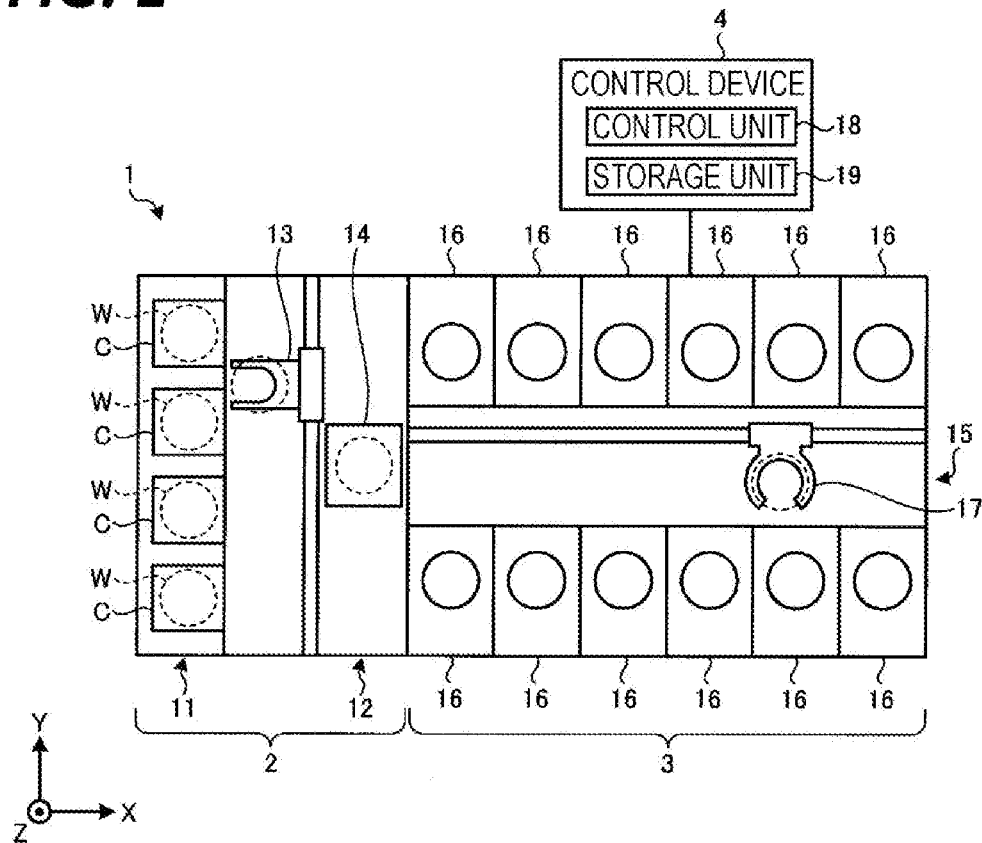
FIG. 1 is a view illustrating a schematic configuration of a substrate processing system according to an exemplary embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

The above-described related art has room for further improvement in terms of space saving.

Specifically, although stacking processing units as described above is effective for improving a throughput while ensuring space saving, there is a demand to limit the height of the apparatus if possible even when stacking the processing units since the increase in the number of stacks increases the height of an apparatus.

In this regard, in the apparatus disclosed in Japanese Patent Laid-open Publication No. 2012-142404, a common air supply duct and a common fan unit configured to supply air into the processing units are arranged above each stage of stacked processing units. Thus, it is difficult to meet the above-described demand An aspect of an exemplary embodiment provides a substrate processing apparatus capable of further ensuring space saving.

A substrate processing apparatus includes a plurality of processing units and a gas supply unit. The plurality of processing units are stacked and arranged, and each configured to hold a substrate in a chamber and to process the substrate by a processing liquid, and the gas supply unit is provided for each of the processing units to supply a gas into each of the processing units. The gas supply unit includes an intake unit and an air supply unit. The intake unit takes in and purifies outside air, and the air supply unit configured to supplies a clean air purified by the intake unit into the processing units. In addition, the intake unit is arranged on a lateral side of the chamber, and is arranged on the same side face of the chambers between the stacked and arranged processing units.

The above-described substrate processing apparatus further includes a first exhaust pipe configured to guide exhaust from each of the plurality of processing units. The first exhaust pipe is arranged on the same side face as the intake unit with respect to the chambers, and vertically extends on the side face of the chambers.

The above-described substrate processing apparatus further includes a transfer section provided on a lateral side of the processing units at a position different from the side face on which the intake unit is arranged, and configured to transfer the substrate to the processing units. The first exhaust pipe and the intake unit are arranged in this order from the side close to the transfer section.

In the above-described substrate processing apparatus, the intake unit includes an outside air intake port opened toward a side opposite to the side where the transfer section is disposed.

The above-described substrate processing apparatus further includes a second exhaust pipe configured to exhaust an atmosphere around a processing liquid supply system. The second exhaust pipe is arranged to pass through a lateral side opposite to the side face on which the intake unit is arranged or a lateral side of the intake unit, with respect to the chamber.

In the above-described substrate processing apparatus, the second exhaust pipe accommodates a pipe configured to supply the processing liquid into the processing unit.

In the above-described substrate processing apparatus, the plurality of processing units are configured to be supplied with plural types of processing liquids. The substrate processing apparatus further comprises an exhaust switching unit including a plurality of individual exhaust pipes each corresponding to at least one of the plural types of processing liquids, and configured to switch an outflow destination of exhaust flowing in the first exhaust pipe to one of the individual exhaust pipes. The exhaust switching unit is arranged above the stacked processing units, and an exhaust port of the second exhaust pipe is connected to the exhaust switching unit.

According to the aspect of the exemplary embodiment, space saving may be further ensured.

Hereinafter, exemplary embodiments of a substrate processing apparatus disclosed herein will be described in detail with reference to the accompanying drawings. Further, the present disclosure is not limited to the following exemplary embodiments.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer section 14. The wafer W placed on the transfer section 14 is taken out from the transfer section 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
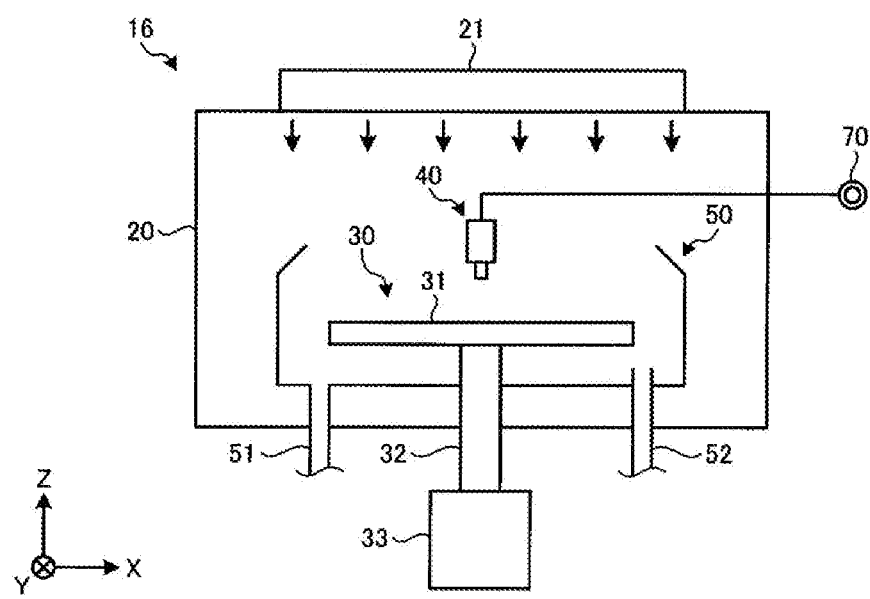
FIG. 2 is a view illustrating a schematic configuration of a processing unit.

Next, a configuration of the processing unit 16 will be described with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid supply source 70.

The recovery cup 50 is arranged to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

Figure 3:
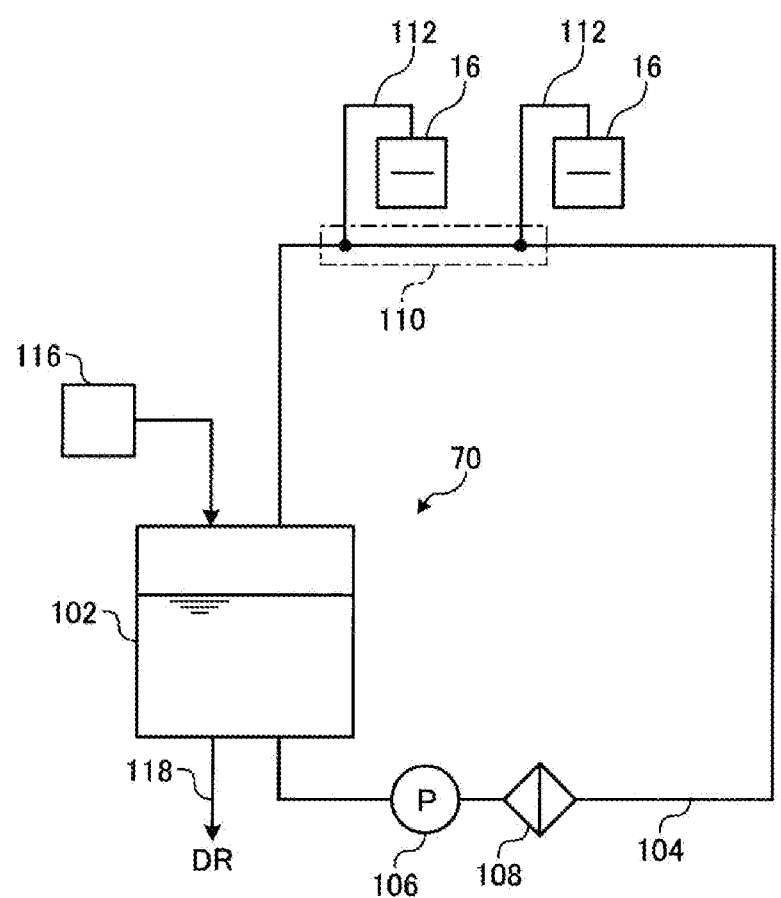
FIG. 3 is a view illustrating a schematic configuration of a processing liquid supply system included in the substrate processing system.

Next, a schematic configuration of a processing liquid supply system included in the processing unit 1 will be described with reference to FIG. 3. FIG. 3 is a view illustrating a schematic configuration of a processing liquid supply system included in the substrate processing system 1.

As illustrated in FIG. 3, the processing liquid supply system included in the substrate processing system 1 has a processing fluid supply source 70 that supplies a processing liquid into a plurality of processing units 16.

The processing fluid supply source 70 has a tank 102 that stores the processing liquid and a circulation line 104 that comes out from the tank 102 and returns to the tank 102. The circulation line 104 is provided with a pump 106. The pump 106 forms a circulation flow that comes out from the tank 102 and returns to the tank 102 through the circulation line 104. A filter 108 is provided in the circulation line 104 on the downstream side of the pump 106 in order to remove contaminants such as, for example, particles included in the processing liquid. Additional auxiliary machinery (e.g., a heater) may be further provided in the circulation line 104 as needed.

One or more branch lines 112 are connected to a connection area 110 set in the circulation line 104. Each of the branch lines 112 supplies the processing liquid flowing through the circulation line 104 into the processing unit 16 corresponding thereto. For example, a flow rate control mechanism such as, for example, a flow rate control valve and a filter may be provided in each of the branch lines 112 as needed.

The substrate processing system 1 has a tank liquid replenishment unit 116 that replenishes a processing liquid or a component of the processing liquid to the tank 102. A drain section 118 is provided in the tank 102 to discard the processing liquid in the tank 102.

Figure 4:
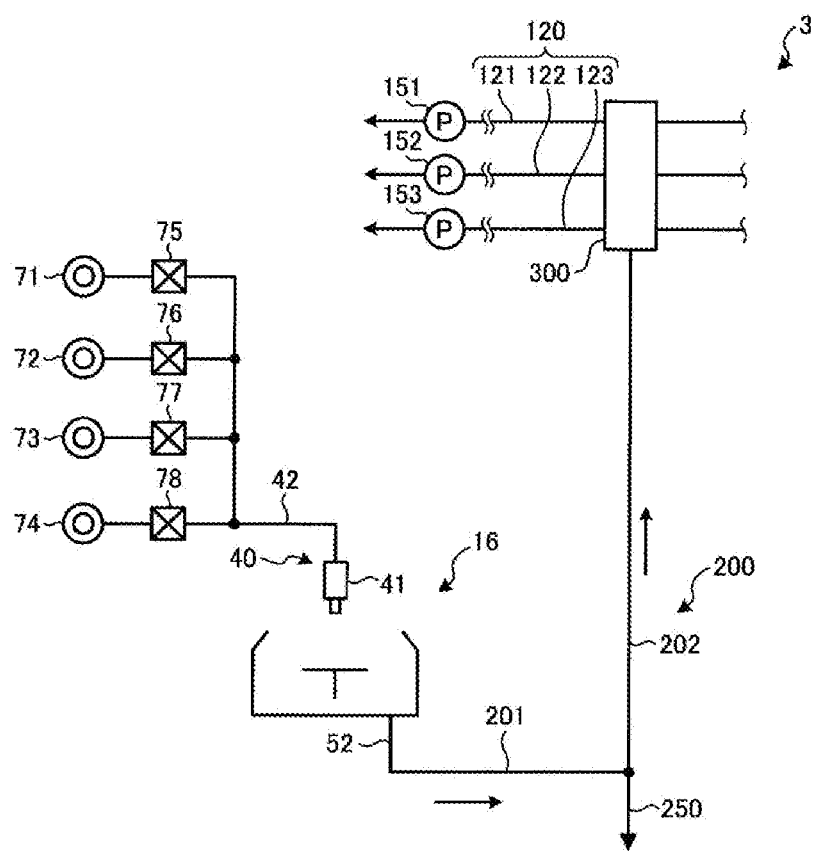
FIG. 4 is a view illustrating an exhaust path of the processing unit.

Next, an exhaust path of a processing unit 16 will be described with reference to FIG. 4. FIG. 4 is a view illustrating the exhaust path of the processing unit 16. FIG. 4 mainly represents components required to describe the exhaust path of the processing unit 16, and omits descriptions of common components.

The configuration of the processing unit 16 according to the exemplary embodiment will be first described. As illustrated in FIG. 4, the processing fluid supply unit 40 included in the processing unit 16 is provided with a nozzle 41 and a pipe 42, one end of which is connected to the nozzle 41. The other end of the pipe 42 is branched into a plurality of branches, and an alkali-based processing liquid supply source 71, an acid-based processing liquid supply source 72, an organic-based processing liquid supply source 73, and a DIW supply source 74 are connected to each of the branching ends. Also, valves 75 to 78 are provided between each of the supply sources 71 to 74 and the nozzle 41.

The processing fluid supply unit 40 supplies the alkali-based processing liquid, the acid-based processing liquid, the organic-based processing liquid, and the DIW (pure water) supplied from the respective supply sources 71 to 74 onto a surface (a processing target surface) of a wafer W from the nozzle 41.

In the exemplary embodiment, SC1 (a mixed solution of ammonia, hydrogen peroxide, and water) is used as an alkali-based processing liquid, hydrofluoric acid (HF) is used as an acid-based processing liquid, and isopropyl alcohol (IPA) is used as an organic-based processing liquid. Meanwhile, the acid-based processing liquid, the alkali-based processing liquid, and the organic-based processing liquid are not limited to those described above.

In addition, in the exemplary embodiment, the alkali-based processing liquid, the acid-based processing liquid, and the organic-based processing liquid, and DIW are supplied from a single nozzle 41, but the processing fluid supply unit 40 may be provided with a plurality of nozzles corresponding to the processing liquids, respectively.

Specifically, an alkali-based exhaust discharged from the processing unit 16 when using SC1, an acid-based exhaust discharged from the processing unit 16 when using HF, and an organic-based exhaust discharged from the processing unit 16 when using IPA are required to be discharged individually in view of, for example, suppression of exhaust pipe contamination. Thus, in the substrate processing system 1 according to the exemplary embodiment, an exhaust path is provided for each of the alkali-based exhaust, the acid-based exhaust, and the organic-based exhaust.

A description will be made on the configuration of the exhaust path. The processing station 3 of the substrate processing system 1 includes a main exhaust pipe 120, a first exhaust pipe 200, and an exhaust switching unit 300 as exhaust paths of the processing unit 16.

The main exhaust pipe 120 includes a plurality of individual exhaust pipes 121 to 123. The individual exhaust pipe 121 is an exhaust pipe in which the alkali-based exhaust flows, the individual exhaust pipe 122 is an exhaust pipe in which the acid-based exhaust flows, and the individual exhaust pipe 123 is an exhaust pipe in which the organic-based exhaust flows. Exhaust mechanisms 151 to 153 are provided in the individual exhaust pipes 121 to 123, respectively. As for the exhaust mechanisms 151 to 153, suction devices such as, for example, pumps may be used.

The individual exhaust pipes 121 to 123 according to the exemplary embodiment are at least partially arranged above the processing unit 16. The specific arrangement of the individual exhaust pipes 121 to 123 will be described later.

The first exhaust pipe 200 is an exhaust pipe that guides the exhaust from the processing unit 16 to the main exhaust pipe 120. One end of the first exhaust pipe 200 is connected to the exhaust port 52 of the processing unit 16, and the other end of the first exhaust pipe 200 is connected to a portion arranged above the processing unit 16 of the main exhaust pipe 120 via the exhaust switching unit 300 (to be described later).

The first exhaust pipe 200 is provided with a horizontal section 201 that extends horizontally from the exhaust port 52 of the processing unit 16 and an ascending section 202 that is provided at the downstream side of the horizontal section 201 and extends vertically upwardly. In addition, a drain section 250 is provided at the lowest position of the ascending section 202 to discharge the liquid within the first exhaust pipe 200 to the outside.

The exhaust switching unit 300 is connected to the ascending section 202 of the first exhaust pipe 200 and switches the outflow destination of the exhaust from the processing unit 16 to one of the individual exhaust pipes 121 to 123. Similarly to the main exhaust pipe 120, the exhaust switching unit 300 is also arranged above the processing unit 16.

The exhaust path of the processing unit 16 is configured as described above, and the exhaust from the processing unit 16 flows out to one of the individual exhaust pipes 121 to 123 through the first exhaust pipe 200 and the exhaust switching unit 300.

Here, as described above, in the substrate processing system 1 according to the exemplary embodiment, at least a portion of the main exhaust pipe 120 and the exhaust switching unit 300 are arranged above the processing unit, and the other end of the first exhaust pipe 200 is connected to a portion arranged above the processing unit 16 of the main exhaust pipe 120 via the exhaust switching unit 300. Thus, the exhaust from the processing unit 16 is caused to rise up in the ascending section 202 of the first exhaust pipe 200 and then to flow out from the exhaust switching unit 300 to the main exhaust pipe 120.

Further, although not illustrated herein, in the exemplary embodiment, it is assumed that an exhaust path is further formed to exhaust the atmosphere around processing fluid supply lines such as, for example, the respective supply sources 71 to 74 and the valves 75 to 78. The exhaust paths are formed using a second exhaust pipe 500 or a third exhaust pipe 600 to be described later (see, e.g., FIG. 7G which will be described later) and is connected to the exhaust switching unit 300 so as to be exhausted using the main exhaust pipe 120. As a result, it is possible to exhaust the processing liquid in preparation for, for example, leakage of the processing fluid around the processing fluid supply lines.

Hereinafter, a more specific configuration of the processing station 3 including the arrangement of the main exhaust pipe 120, the first exhaust pipe 200, and the exhaust switching unit 300, as described above, will be described sequentially with reference to FIGS. 5A to 5D.

First, the processing station 3 includes a frame structure 400 having a plurality of column sections 401 and a plurality of beam sections 402. A plurality of processing units 16 are accommodated in the space formed by the column sections 401 and the beam sections 402. The plurality of processing units 16 are arranged in parallel along the extending direction of the transfer section 15 (see, e.g., FIG. 1), that is, along the X-axis direction, and are stacked in multiple stages.

Here, a schematic configuration of the frame structure 400 according to the exemplary embodiment is described with reference to FIGS. 5A to 5D. FIGS. 5A to 5D are views illustrating a schematic configuration of the frame structure 400.

Figure 5A:
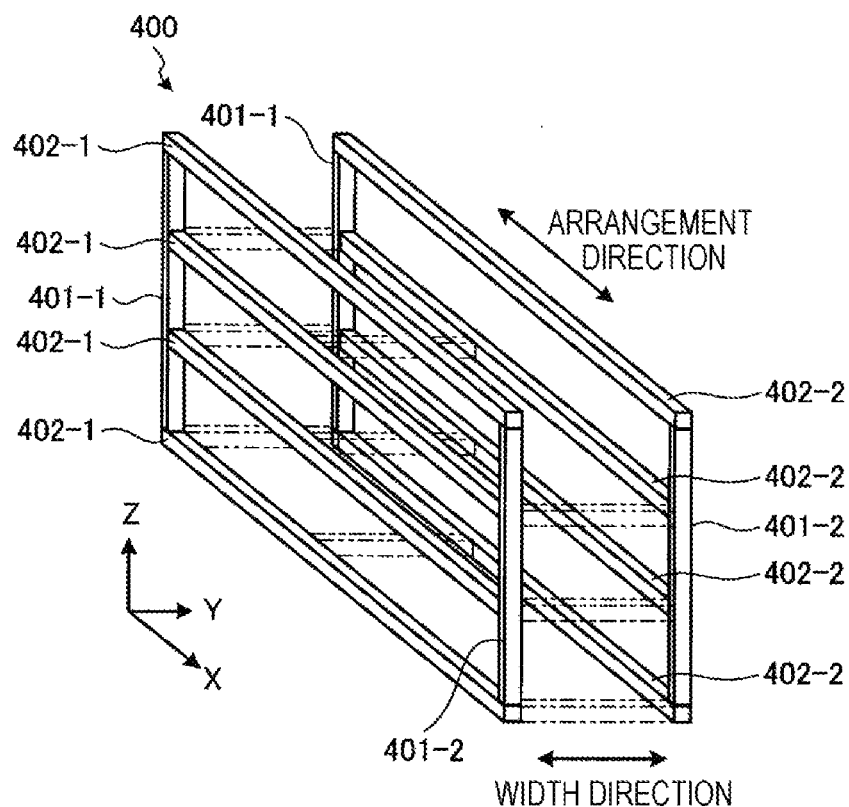
FIG. 5A is a perspective view illustrating a schematic configuration of a frame structure.
Figure 5B:
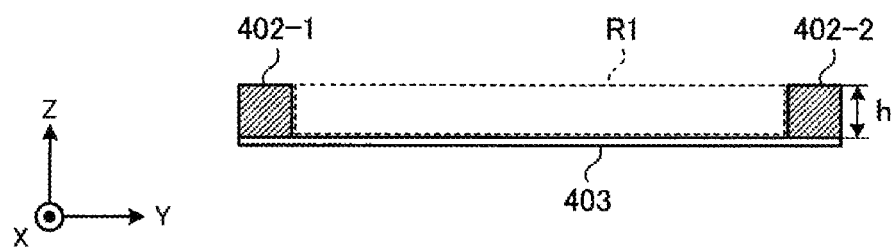
FIG. 5B is a cross-sectional view illustrating the schematic configuration of the frame structure, in which a set of first and second beam sections are cut along a YZ plane.
Figure 5C:
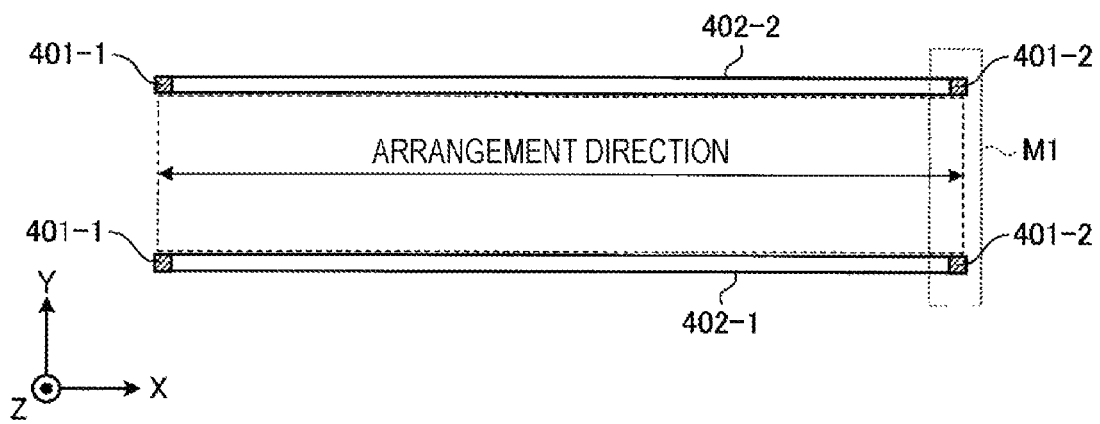
FIG. 5C is a cross-sectional view illustrating the schematic configuration of the frame structure, in which the set of first and second column sections are cut along an XY plane.
Figure 5D:
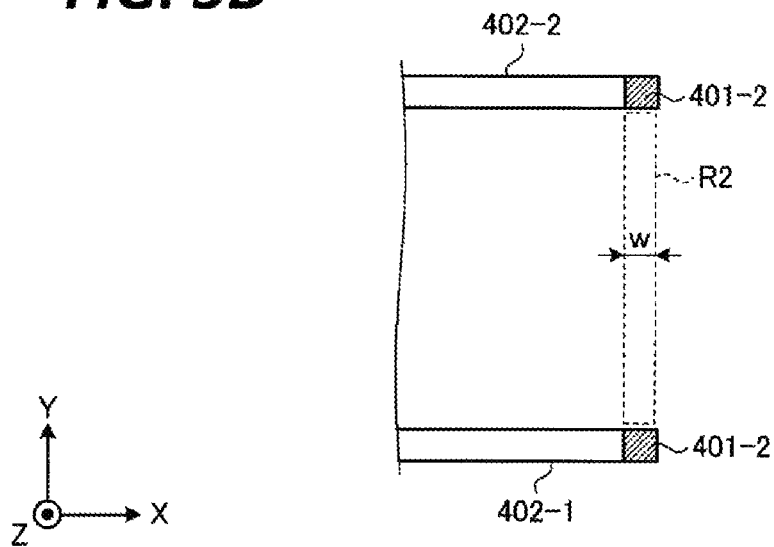
FIG. 5D is a view illustrating the schematic configuration of the frame structure, in which a portion indicated by "M1" is illustrated in an enlarged scale.

Meanwhile, FIG. 5A is a schematic perspective view of the frame structure 400, FIG. 5B is a cross-sectional view in which a set of a first beam section 402-1 and a second beam section 402-2 facing each other is cut along the YZ plane, FIG. 5C is a cross-sectional view in which a set of a first column section 401-1 and a second column section 401-2 facing each other is cut along the XY plane, and FIG. 5D is an enlarged view of a portion indicated by "M1" in FIG. 5C.

As illustrated in FIG. 5A, the columns sections 401 of the frame structure 400 at least include first column sections 401-1 each provided perpendicular to an X-axis negative direction end and second column sections 401-2 each provided perpendicular to an X-axis positive direction end.

Further, the beam sections 402 of the frame structure 400 include first beam sections 402-1 provided horizontally in the arrangement direction of the processing units 16 (i.e., along the X-axis direction), provided in multiple stages, and each disposed on a Y-axis negative direction side of the processing units 16, and second beam sections 402-2 each arranged parallel with the first beam sections 402-1 and each disposed on the Y-axis positive direction side of the processing units 16.

Meanwhile, angle materials such as angle pipes or profile materials may be used for the column sections 401 or the beam sections 402. When the angle materials are used, it may be easy to form accommodating regions for members (e.g., pipes) between the respective facing surfaces of the angle materials.

In addition, as illustrated in FIG. 5A, in the frame structure 400, a structure including a first column section 401-1, a second column section 401-2, and a plurality of first beam sections 402-1, and a structure including a first column section 401-1, a second column section 401-2, and a plurality of second beam sections 402-2 are basically combined to form an accommodating space.

However, in the exemplary embodiment, as illustrated by a two-dotted chain line in FIG. 5A, the frame structure 400 is structured such that beams extending in the width direction are not provided as much as possible. In the exemplary embodiment, as illustrated in FIG. 5B, each of the bottom surfaces of a set of facing first and second beam sections 402-1 and 402-2 is connected by a plate material 403.

As a result, an accommodating region R1 having a height h of the first beam sections 402-1 may be formed between the facing surfaces of the first beam section 402-1 and the second beam section 402-2, as illustrated in FIG. 5B, and over the entire arrangement direction, as illustrated in FIG. 5C.

Further, since the first beam section 402-1 and the second beam section 402-2 are connected by the plate material 403 as described above, for example, an accommodating region R2 having a width w of the second column sections 401-2 may be formed between the facing surfaces of a set of second column sections 401-2, and along the extending direction of the second column sections 401-2, as illustrated in FIG. 5D.

The exemplary embodiment further ensures the space saving of the entire apparatus by utilizing the accommodating regions R1 and R2 and accommodating various components of the processing station 3 such as the processing units 16 in the accommodating spaces of the frame structure 400. The specific examples thereof will be sequentially described below.

Figure 6A:
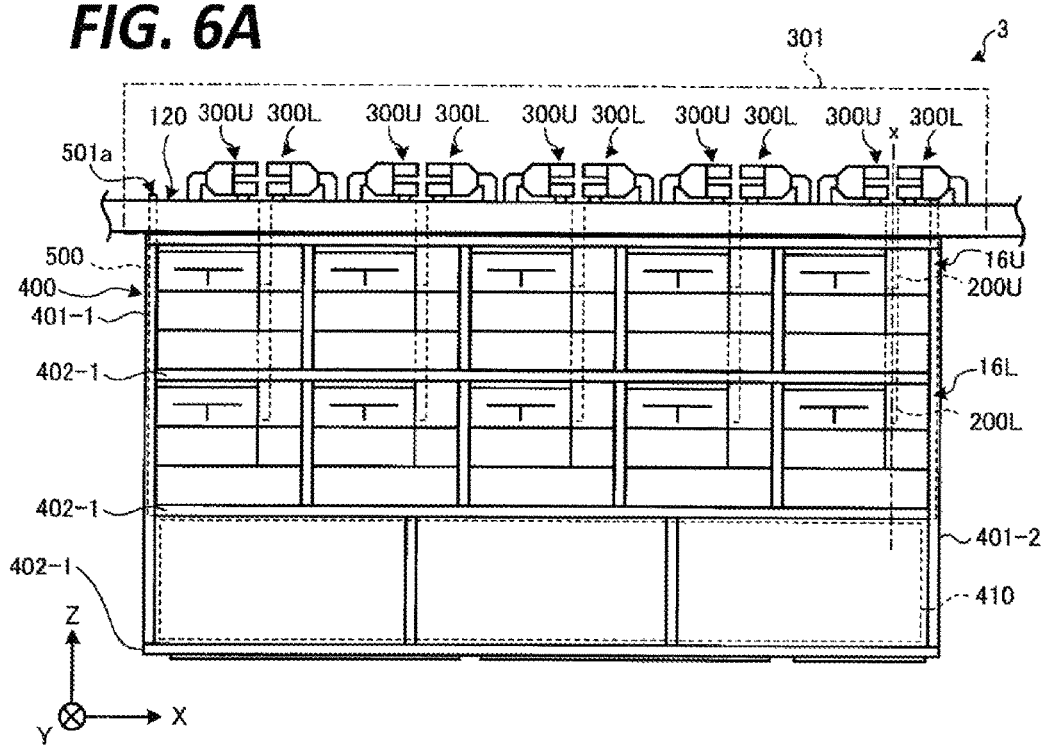
FIG. 6A is a schematic front view of a processing station.
Figure 6B:
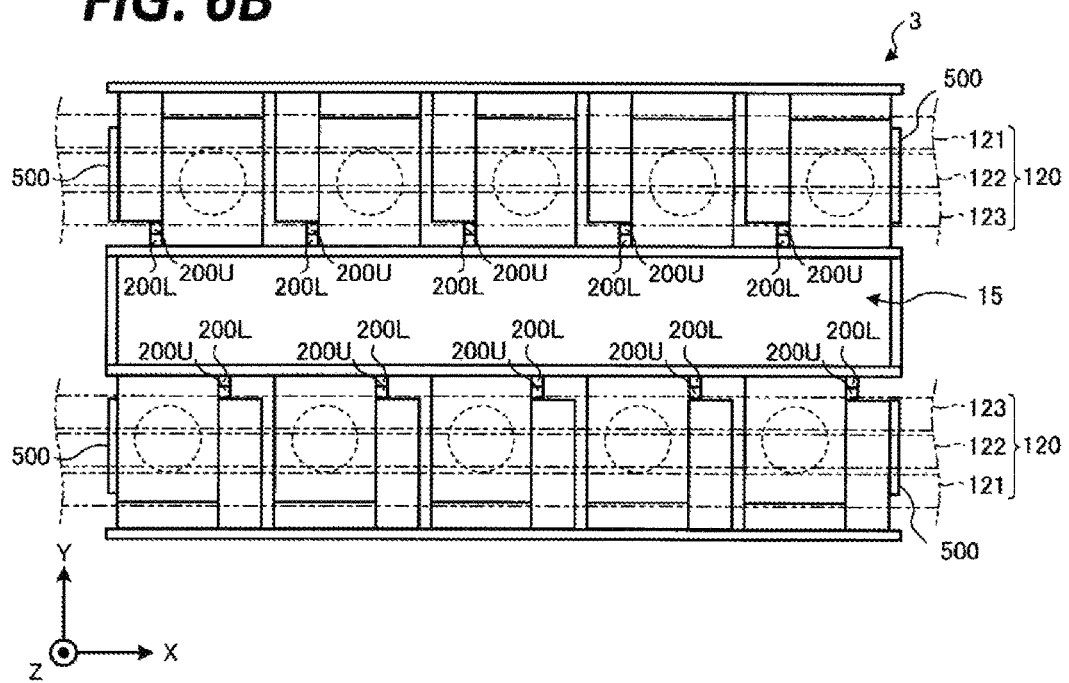
FIG. 6B is a schematic plan view of the processing station.

FIG. 6A is a schematic front view of the processing station 3. FIG. 6B is a schematic plan view of the processing station 3. Herein, the front view refers to a view obtained by viewing the processing station 3 from a maintenance area side in the Y-axis positive direction, and the plan view refers to a view obtained by viewing the processing station 3 in the Z-axis negative direction from the maintenance area side. Further, the maintenance area side refers to the side oriented toward the arrangement of the processing units 16 from the outside of the processing station 3.

As illustrated in FIG. 6A, in the present exemplary embodiment, the processing units 16 are stacked vertically in, for example, two stages. In the following description, among the processing units 16 stacked vertically in two stages, the processing units 16 arranged in the upper stage may be referred to as "processing units 16U" and the processing units 16 arranged in the lower stage may be referred to as "processing units 16L."

Meanwhile, the present exemplary embodiment represents a case where the processing units 16 are stacked vertically in two stages as an example, but the number of stacking the processing units 16 is not limited to two. Further, although the present exemplary embodiment represents a case where five processing units 16 are arranged in parallel with each other as an example, the number of arranging the processing units 16 in parallel with each other is not limited to five.

The individual exhaust pipes 121 to 123 of the main exhaust pipe 120 are arranged above the frame structure 400, as illustrated in FIG. 6A. Further, as illustrated in FIG. 6A, a plurality of exhaust switching units 300 corresponding to respective processing units 16 are arranged above the respective exhaust pipes 121 to 123. In addition, the main exhaust pipe 120 and the exhaust switching units 300 are accommodated in a housing 301 and are partitioned by the frame structure 400. The housing 301 is in communication with external space so that external air may be taken therein.

Further, as illustrated in FIG. 6A, the main exhaust pipe 120 is arranged above the processing units 16U arranged in the upper stage, and the first exhaust pipes 200U and 200L corresponding to the processing units 16U of the upper stage and the processing units 16L of the lower stage, respectively, are connected through the exhaust switching units 300U and 300L.

As described above, in the exemplary embodiment, the main exhaust pipe 120 is shared by the processing units 16U of the upper stage and the processing units 16L of the lower stage. For this reason, the manufacturing costs of the substrate processing system 1 may be reduced compared to a case where main exhaust pipes 120 are provided in the processing units 16U of the upper stage and the processing units 16L of the lower stage, respectively. Further, further space saving space may be ensured by suppressing the increase of the height of the processing station 3.

Meanwhile, as illustrated in FIG. 6B, the substrate processing system 1 includes the main exhaust pipe 120 that corresponds to the processing units 16 arranged on the Y-axis negative direction side with respect to the transfer section 15, and the main exhaust pipe 120 that corresponds to the processing unit 16 arranged in the Y-axis direction side with respect to the transfer section 15. Each of the main exhaust pipes 120 is arranged above the area in which the corresponding processing units 16 are arranged.

Herein, among the plurality of first exhaust pipes 200, the first exhaust pipes 200U connected to the processing units 16U of the upper stage and the first exhaust pipes 200L connected to the processing units 16U of the lower stage are arranged side by side behind some of the processing units 16U and 16L.

For example, as illustrated in FIGS. 6A and 6B, the first exhaust pipes 200U and 200L are arranged behind some of the processing units 16U and 16L in the order of the first exhaust pipe 200L and the first exhaust pipe 200L from the side close to the transfer section 15. Some of the processing unit 16U and 16L referred to herein correspond to an intake unit 21a of the FFU 21 to be described later (see, e.g., FIG. 6D to be illustrated later).

Further, among the plurality of exhaust switching units 300, the exhaust switching units 300U corresponding to the processing units 16U of the upper stage and the exhaust switching units 300L corresponding to the processing units 16L of the lower stage are alternatively arranged along the arrangement direction of the processing units 16.

In addition, the exhaust switching units 300U and the exhaust switching units 300L have the same structure and are arranged so as to face each other. Specifically, as illustrated in FIG. 6A, when the processing station 3 is viewed in the Y-axis positive direction, the exhaust switching units 300U corresponding to the processing units 16U of the upper stages and the exhaust switching units 300L corresponding to the processing units 16L of the lower stages are arranged in line symmetry about a center line x of the first exhaust pipes 200U and 200L connected to the processing units 16U and 16L.

As described above, in the present exemplary embodiment, the first exhaust pipes 200U connected to the processing units 16U of the upper stage and the first exhaust pipes 200L connected to the processing units 16U of the lower stage are arranged side by side behind some of the processing units 16U and 16L. Further, the exhaust switching units 300U corresponding to the processing units 16U of the upper stage and the exhaust switching units 300L corresponding to the processing units 16L of the lower stage are arranged in line symmetry about a center line x of the first exhaust pipes 200U and 200L such that the exhaust switching units 300U and 300L face each other.

With this arrangement, it becomes easier to make the first exhaust pipes 200U and 200L and the exhaust switching units 300U and 300L common in the upper and lower stages. Meanwhile, the exhaust switching units 300U and the exhaust switching units 300L may not be necessarily be arranged to face each other.

Further, as illustrated in FIGS. 6A and 6B, the processing station 3 includes second exhaust pipes 500. The second exhaust pipes 500 constitute a path in the vertical direction among the exhaust paths that exhaust the atmosphere around the processing fluid supply lines as described above.

As illustrated in FIGS. 6A and 6B, the second exhaust pipes 500 are arranged between the facing surfaces of the set of first column sections 401-1 corresponding to the above-described accommodating region R2 (see, e.g., FIG. 5D) or between the facing surfaces of the set of second column sections 401-2. With this arrangement, exhaust paths utilizing the accommodating region R2 may be formed, which may be helpful in space saving of the entire apparatus.

In addition, third exhaust pipes 600 (see, e.g., FIG. 7G) constitute a path in the vertical direction among the exhaust paths that exhaust the atmosphere around the processing fluid supply lines. The third exhaust pipes 600 are arranged between the facing surfaces of the first beam sections 402-1 and the second beam sections 402-2 corresponding to the above-described accommodating region R1 (see, e.g., FIG. 5B). With this arrangement, exhaust paths utilizing the accommodating region R1 may be formed, which may be helpful in space saving of the entire apparatus. The details of the second exhaust pipes 500 and the third exhaust pipes 600 will be described sequentially with reference to FIGS. 7A to 7G.

Meanwhile, exhaust ports 501a of the exhaust paths formed by the second exhaust pipes 500 and the third exhaust pipes 600 are connected to the housing 301 that accommodates the exhaust switching units 300, as illustrated in FIG. 6A.

Figure 6C:
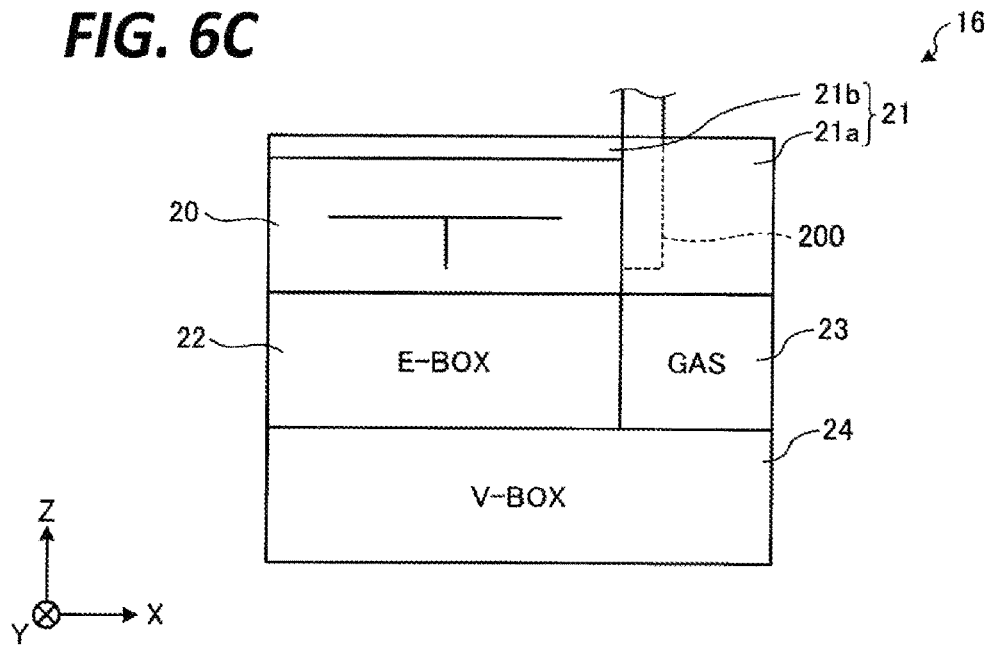
FIG. 6C is a schematic front view of the processing unit.
Figure 6D:
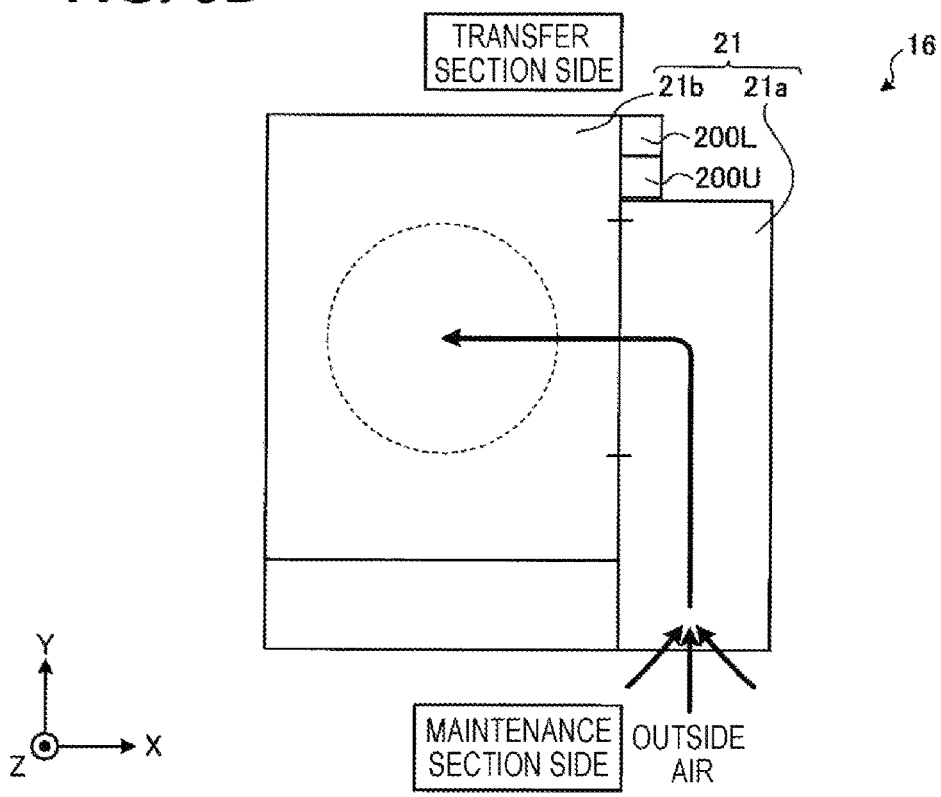
FIG. 6D is a schematic plan view of the processing unit, in which an intake unit and an air supply unit are illustrated in an enlarged scale.

Next, a specific configuration of a processing unit 16 will be described with reference to FIGS. 6C and 6D. FIG. 6C is a schematic front view of the processing unit 16. FIG. 6D is a schematic plan view of the processing unit 16.

As illustrated in FIG. 6C, the processing unit 16 includes the chamber 20 and the FFU 21. The FFU 21 includes an intake unit 21a and an air supply unit 21b. The intake unit 21a is a unit for taking in outside air and is arranged on a lateral side of the chamber 20. The intake unit 21a is arranged on the same side face of the chambers 20 of the stacked processing units 16. Further, as illustrated in FIG. 6D, the intake unit 21a takes in outside air from the maintenance area, and sends the purified air to the air supply unit 21b while purifying the outside air into clear air by, for example, a filter. Meanwhile, as illustrated in FIG. 6D, the intake unit 21a is arranged to form an empty space on the side of the transfer section 15 with respect to the air supply unit 21b.

As illustrated in FIGS. 6C and 6D, the air supply unit 21b is arranged above the chamber 20 so as to be opened at the chamber 20 side and is connected to the intake unit 21a laterally so as to communicate with the intake unit 21a. Then, the air supply unit 21b forms a downflow in the chamber 20 by the purified air sent from the intake unit 21a.

In this manner, by forming the individual intake unit 21a for the outside air on one lateral side of the chamber 20 in each of the plurality of processing units 16, it is possible to suppress the height from being increased when the processing units 16 are stacked. That is, space saving may be further ensured.

Further, the downflow may be adjusted for each processing unit 16 by providing the outside air intake unit 21a in each of the plurality of processing units 16 in this way. That is, the processing quality of the wafers W in each of the plurality of processing units 16 may be maintained uniformly.

As illustrated in FIGS. 6C and 6D, the above-described first exhaust pipes 200U and 200L are arranged in the above-described empty space which is positioned behind the intake unit 21a and on a lateral side of the chamber 20. That is, with respect to the transfer section 15 provided on the side face of the processing unit 16 at a position different from the side on which the intake unit 21a is arranged, the first exhaust pipe 200L, the first exhaust pipe 200U, and the intake unit 21a are arranged in this order from the side close to the transfer section 15. In this manner, the first exhaust pipes 200U and 200L are arranged on the same side face as the intake unit 21a with respect to the chambers 20, and vertically extend on the same side face of the chamber 20. As a result, while the intake unit 21a is individually provided in the processing unit 16, the space occupied by the processing unit 16 may be suppressed from being increased by the first exhaust pipes 200U and 200L. That is, this arrangement may be helpful in space saving of the entire apparatus.

Further, as illustrated in FIG. 6C, an electric component box 22 is arranged in the lower portion of the chamber 20. The electronic component box 22 is a container in which electric components are housed. For example, a driving unit 33 (see, e.g., FIG. 2) is housed in the electric component box 22. A gas box 23 is arranged in the lower portion of the intake unit 21a. The gas box 23 is a container in which components constituting a low dew-point gas supply line to be described later are housed. For example, a valve 23b (see, e.g., FIG. 9C to be described later) is housed in the gas box 23. A more specific configuration of the FFU 21 including the supply line of the low dew-point gas will be described with reference to FIGS. 9A to 9D.

Further, a valve box 24 is arranged below the electronic device box 22 and the gas box 23. The valve box 24 is a container in which components constituting the processing fluid supply lines are housed. For example, flow controllers including valves 75 to 78 (see, e.g., FIG. 4), filters, and flow meters are housed in the valve box 24. In addition, the above-described third exhaust pipe 600 is connected to the lower portion of the valve box 24 so as to communicate therewith.

Next, the configuration of the exhaust paths that exhaust the atmosphere around the processing fluid supply lines, including the above-described third exhaust pipe 600 and second exhaust pipe 500, will be described with reference to FIGS. 7A to 7G.

Figure 7A:
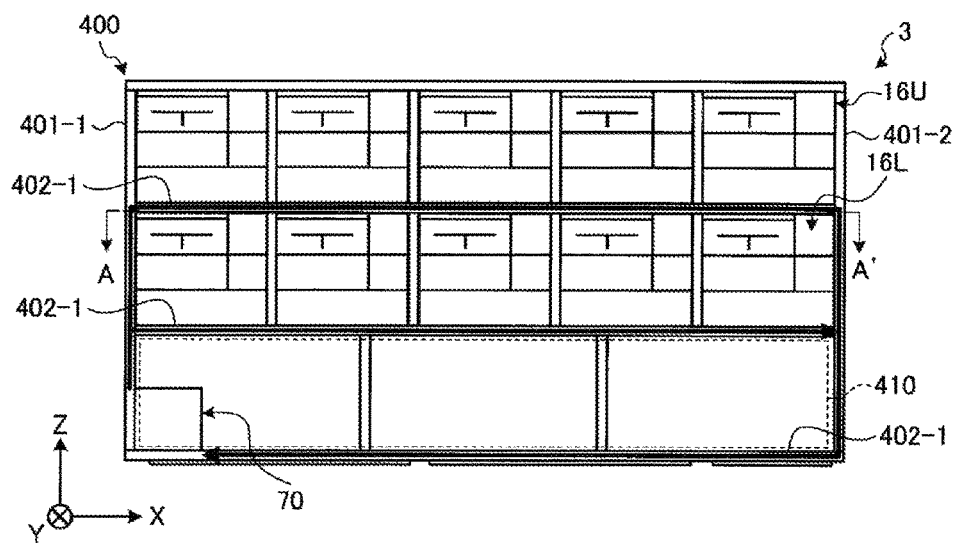
FIG. 7A is a schematic front view of the processing station in which a supply line of a processing fluid is illustrated.
Figure 7B:
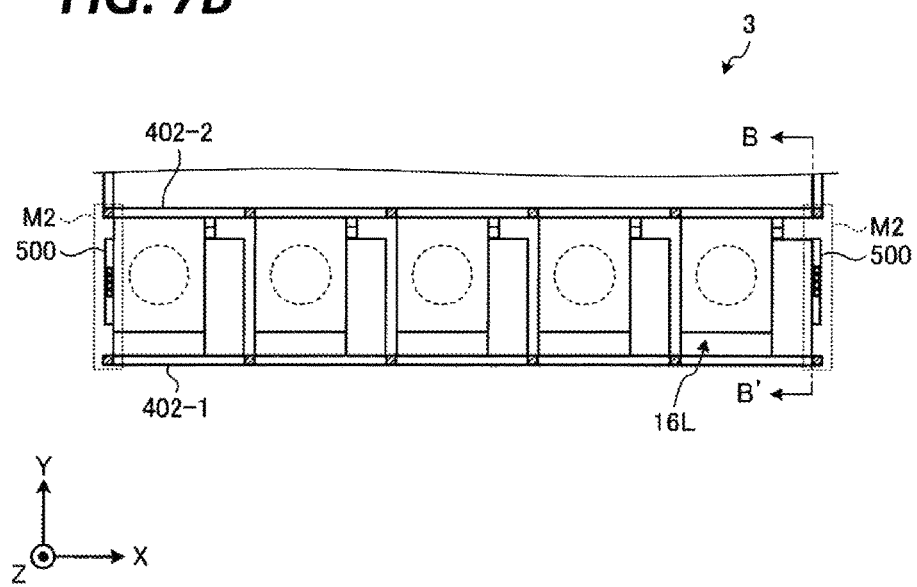
FIG. 7B is a schematic cross-sectional view taken along line A-A' of FIG. 7A.
Figure 7C:
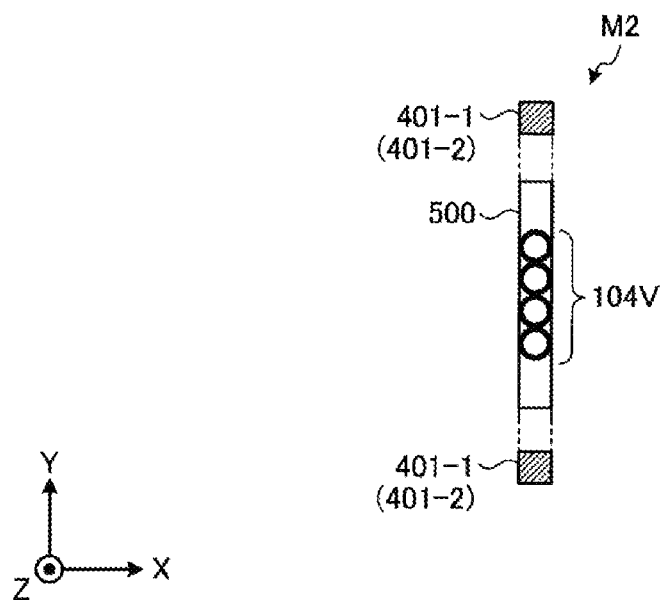
FIG. 7C is a view illustrating a portion indicated by M2 in FIG. 7B in an enlarged scale.
Figure 7D:
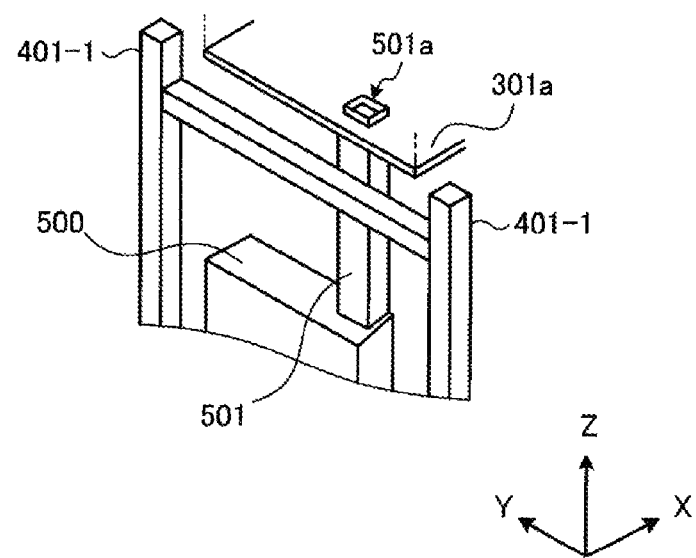
FIG. 7D is a schematic perspective view illustrating a connection point between a second exhaust pipe and a housing.

FIG. 7A is a schematic front view of the processing station 3 in which the supply line of the processing fluid is illustrated. FIG. 7B is a schematic cross-sectional view taken along line A-A' of FIG. 7A. FIG. 7C is an enlarged view of a portion indicated by M2 in FIG. 7B. FIG. 7D is a schematic perspective view illustrating a connection point between the second exhaust pipe 500 and the housing 301.

Figure 7E:
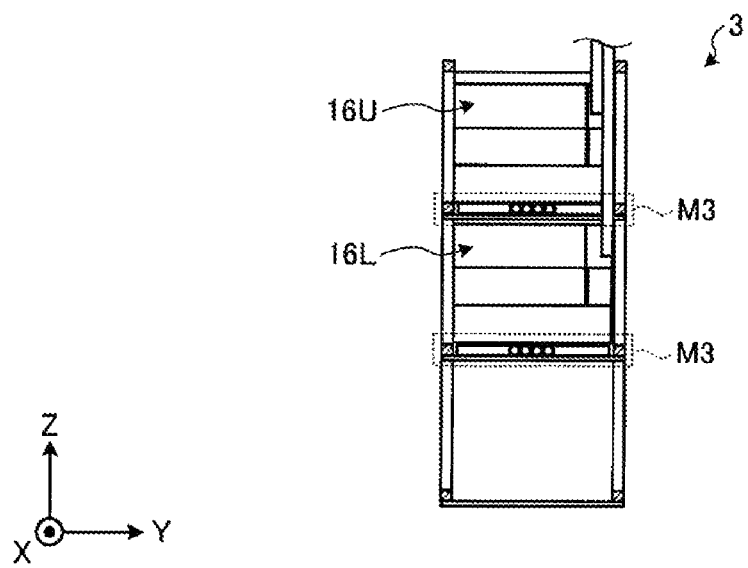
FIG. 7E is a schematic cross-sectional view taken along line B-B' of FIG. 7B.
Figure 7F:
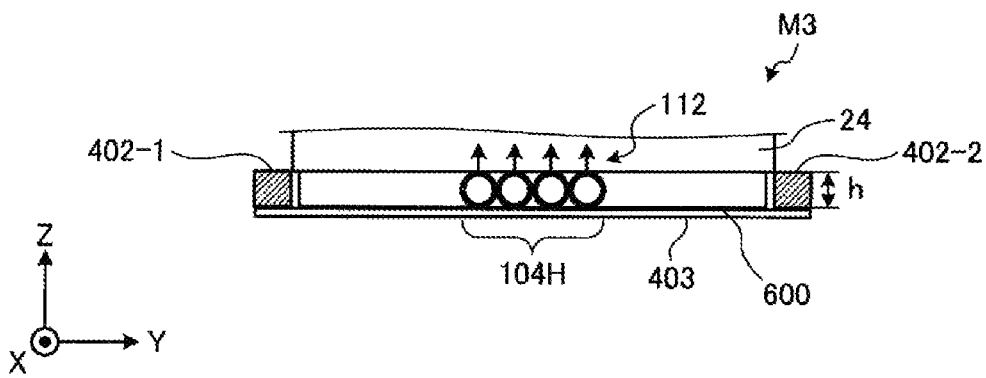
FIG. 7F is an enlarged view of a portion indicated by "M3" illustrated in FIG. 7E.
Figure 7G:
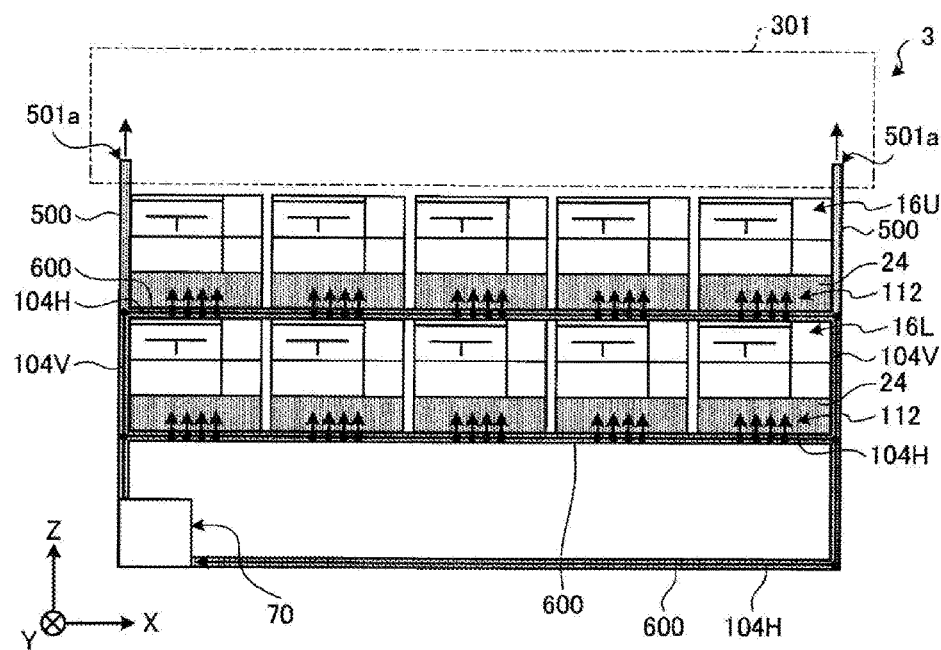
FIG. 7G is a schematic front view of the processing station, in which an exhaust path that exhausts an atmosphere around the supply line of the processing fluid are illustrated.

FIG. 7E is a schematic cross-sectional view taken along line B-B' of FIG. 7B. FIG. 7F is an enlarged view of a portion indicated by M3 in FIG. 7E. FIG. 7G is a schematic front view of the processing station 3 illustrating an exhaust path that exhausts an atmosphere around the supply line of the processing fluid.

First, it is assumed that a processing fluid supply source 70 is arranged in an extra space 410 of the frame structure 400, as illustrated in FIG. 7A.

As illustrated by a bold arrow in FIG. 7A, the processing fluid supply lines are formed, for example, to pass through the back of the first column section 401-1 vertically from the processing fluid supply source 70, to branch off halfway, and to horizontally pass through the back of the first beam section 402-1 below each of the processing units 16U and 16L. Further, the supply line of the processing fluid is formed to vertically pass through the back of the second column section 401-2, to horizontally pass through the back of the first beam section 402-1 at the lowermost stage, and to return to the processing fluid supply source 70.

The term "back" used herein corresponds to the above-described "between the facing surfaces." Also, the supply line formed in this manner corresponds to the above-described circulation line 104 (see, e.g., FIG. 3).

First, the circulation lines 104 that vertically pass through the back of the first column section 401-1 or the second column potion 401-2 is formed to pass through the second exhaust pipes 500 which are arranged in the above-described accommodating region R2, as illustrated in FIG. 7B. The second exhaust pipe 500 is arranged to pass through a lateral side opposite to the side face on which the intake unit 21a is arranged, or the lateral side of the intake unit 21a, with respect to the chambers 20.

Specifically, as illustrated in FIG. 7C, the second exhaust pipe 500 is arranged between the facing surfaces of the set of first column sections 401-1 or between the facing surfaces of the set of second column sections 401-2, and vertical pipes 104V forming the circulation line 104 are arranged to pass therethrough. Thus, the second exhaust pipe 500 corresponds to the housing that accommodates the vertical pipes 104V.

The vertical pipes 104V are a plurality of vertical pipe groups provided in parallel in the second exhaust pipes 500, and each of the vertical pipe groups individually passes through the alkali-based processing liquid, the acid-based processing liquid, the organic-based processing liquid, and the DIW (pure water) supplied from the respective supply sources 71 to 74.

Further, as illustrated in FIG. 7D, the upper end portion of the second exhaust pipe 500 is connected such that an exhaust port 501a is opened to the lower portion 301 of the housing 301 of the exhaust switching unit 300 by a connection pipe 501.

In addition, the circulation line 104 that vertically passes through the back of the first beam section 402-1 is arranged so as to pass through the above-described accommodating region R1 below each of the processing units 16U and 16L, as illustrated in FIG. 7E.

Specifically, as illustrated in FIG. 7F, the third exhaust pipe 600 is arranged between the facing surfaces of the first beam sections 402-1 and the second beam sections 402-2, and horizontal pipes 104H forming the circulation line 104 are arranged to pass therethrough. Thus, the third exhaust pipe 600 corresponds to the housing that accommodates the vertical pipes 104H.

The horizontal pipes 104H are a group of a plurality of horizontal pipes provided in parallel in the third exhaust pipes 600, and each of the vertical pipes individually allows one of the fluids supplied from the respective supply sources 71 to 74 to pass therethrough, similarly to the vertical pipes 104V.

Further, the third exhaust pipe 600 is connected to communicate with the valve box 24 in the above-described connection area 110 (see, e.g., FIG. 3), and the branch line 112 is formed to branch off toward the valve box 24. As described above, the branch line 112 is provided with, for example, a flow controller, a filter, and a flow meter as needed, and is housed in the valve box 24. Further, both end portions of the third exhaust pipe 600 are connected to the second exhaust pipe 500.

Meanwhile, as illustrated in FIG. 7F, in the present exemplary embodiment, since the horizontal pipes 104H covering a plurality of processing units 16 are arranged between the facing surfaces of the first beam sections 402-1 and the second beam sections 402-2 having the height h, it is possible to suppress the height of the entire apparatus from being increased by stacking the processing units 16. Therefore, this arrangement may be helpful in space saving of the entire apparatus.

Exhaust paths that exhaust the atmosphere around the supply line of the processing fluid are formed by the second exhaust pipe 500 and the third exhaust pipe 600 configured as described above. Specifically, as illustrated in FIG. 7G, the second exhaust pipes 500 accommodating the vertical pipes 104V, the third exhaust pipes 600 accommodating the horizontal pipes 104H, and the valve boxes 24 communicating with the third exhaust pipes 600 through the branch lines 112 form a housing that shares the atmosphere around the processing fluid lines (see, e.g., the shaded portions in FIG. 7G).

Thus, the atmosphere around the processing fluid supply lines may be exhausted by drawing the atmosphere by the exhaust switching unit 300 through the exhaust port 501a connected to the housing 301 of the exhaust switching unit 300.

Figure 8:
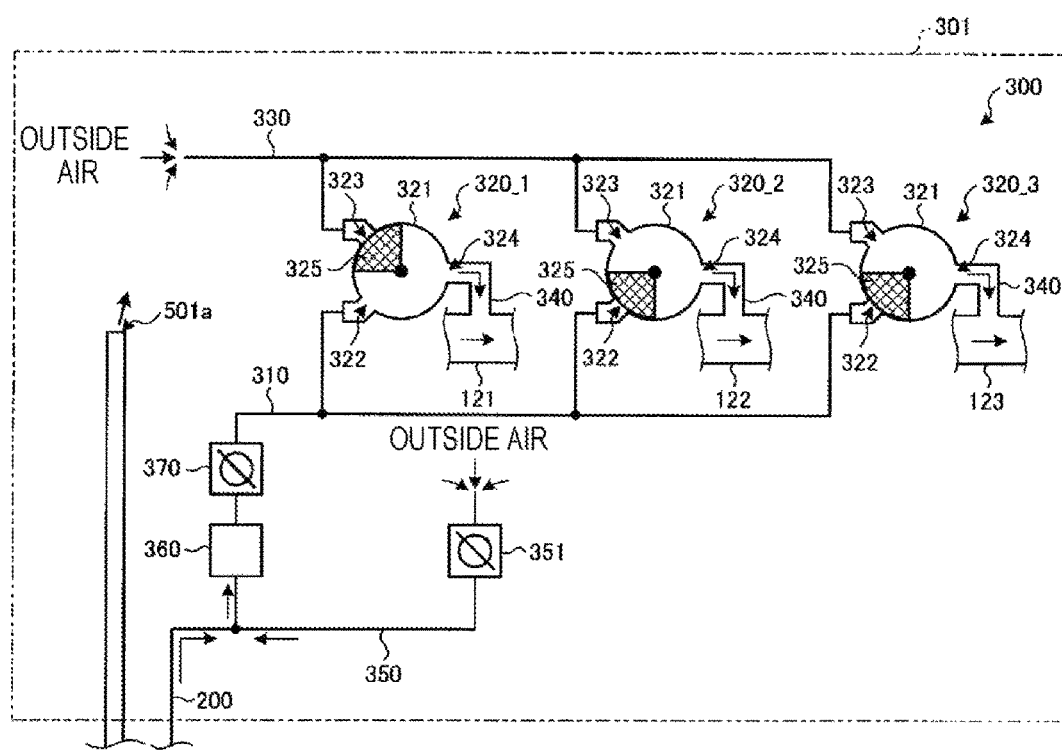
FIG. 8 is a view illustrating a configuration of an exhaust switching unit.

Next, a configuration of the exhaust switching unit 300 will be described with reference to FIG. 8. FIG. 8 is a view illustrating the configuration of the exhaust switching unit 300.

As illustrated in FIG. 8, the exhaust switching unit 300 includes an exhaust introduction unit 310, a plurality of switching mechanisms 320_1 to 320_3, an outside air introduction section 330, and a plurality of outflow sections 340. The exhaust switching unit 300 also includes an outside air intake pipe 350, a differential pressure port 360, and an exhaust flow rate adjustment unit 370. Each of the switching mechanisms 320_1 to 320_3 include a main body 321. The main body 321 has a cylindrical inner space closed at both ends, and the inner peripheral surface of the main body 321 is provided with an exhaust intake port 322 which communicates with the exhaust introduction unit 310, an outside air intake port 323 which communicates with the outside air introduction unit 330, and an outflow port 324 which communicates with the outflow units 340.

A valve body 325 slidable along the inner peripheral surface of the main body 321 is provided in the inner space of the main body 321. The valve body 325 is driven by a driving unit (not illustrated) provided outside the switching mechanisms 320_1 to 320_3. The driving unit is controlled by a control unit 18.

Among the exhaust intake port 322, the outside air intake port 323, and the outflow port 324 formed in the inner peripheral surface of the main body 321, either the exhaust intake port 322 or the outside air intake port 323 is in a state of being blocked by the valve body 325. In other words, only one of the exhaust intake port 322 and the outside air intake port 323 is in communication with the outflow port 324. The switching mechanisms 320_1 to 320_3 slide the valve body 325 along the inner peripheral surface of the main body 321, thereby switching an opening in communication with the outflow port 324 from the exhaust intake port 322 to the outside air intake port 323, or from the outside air intake port 323 to the exhaust intake port 322. That is, the switching mechanisms 320_1 to 320_3 switch the state in which the exhaust introduction unit 310 and the outflow unit 340 are in communication with each other and the state in which the outside air introduction unit 330 and the outflow unit 340 are in communication with each other.

The outside air introduction unit 330 is connected to the switching mechanisms 320_1 to 320_3 and takes in the outside air to supply it to the switching mechanisms 320_1 to 320_3.

Next, a description will be made on the operation in the case where the outflow destination of the exhaust from the processing unit 16 is switched between the individual exhaust pipes 121 to 123.

For example, FIG. 8 illustrates a case where an alkali-based exhaust is supplied to the individual exhaust pipe 121.

In this case, the exhaust switching unit 300 is in the state in which the exhaust intake port 322 of the switching mechanism 320_1 is in communication with the exhaust introduction unit 310 and the outside air intake ports 323 of the remaining switching mechanisms 320_2 and 320_3 are in communication with the outside air introduction unit 330.

In this way, while the switching mechanism 320_1 is in communication with the exhaust introduction unit 310, the remaining switching mechanisms 320_2 and 320_3 are in communication with the outside air introduction unit 330. As a result, the alkali-based exhaust flows into the individual exhaust pipe 121, and the outside air flows into the remaining individual exhaust pipes 122 and 123. In this case, the outside air contains the atmosphere around the processing fluid supply lines, which is drawn through the exhaust port 501a.

The case where the outflow destination of the exhaust is switched from the individual exhaust pipe 121 to the individual exhaust pipe 122 is considered. In this case, by controlling the driving unit 326 of the switching mechanisms 320_1 and 320_2, the control unit 18 makes the exhaust intake port 322 of the switching mechanism 320_2 communicate with the exhaust introduction unit 310 and the outside air intake ports 323 of the remaining switching mechanisms 320_1 and 320_3 communicate with the outside air introduction unit 330. As a result, the acid-based exhaust flows into the individual exhaust pipe 122, and the outside air flows into the remaining individual exhaust pipes 121 and 123. In this case, the outside air contains the atmosphere around the processing fluid supply lines, which is drawn through the exhaust port 501a.

As described above, in the substrate processing system 1 according to the exemplary embodiment, while the exhaust flows into one of the individual exhaust pipes 121 to 123 from the processing unit 16, the outside air flows into the remaining individual exhaust pipes 121 to 123. Thus, the flow rate of the gas flowing into each of the individual exhaust pipes 121 to 123 does not greatly change before and after the exhaust switching. Therefore, the pressure fluctuation of the processing unit 16 due to the fluctuation of the flow rate may be suppressed.

Further, in the substrate processing system 1 according to the exemplary embodiment, the pressure fluctuation of the processing unit 16 during the exhaust switching may be suppressed by providing the outside air introduction unit 330 that communicates with each of the outside air intake ports 323 at the front stages of the outside air intake ports 323 included in the switching mechanisms 320_1 to 320_3.

Next, the case where the outflow destination of the exhaust is switched from the individual exhaust pipe 122 through which the acid-based exhaust flows to the individual exhaust pipe 123 through which the organic-based exhaust flows is considered. In this case, by controlling the driving unit 326 of the switching mechanisms 320_2 and 320_3, the control unit 18 makes the exhaust intake port 322 of the switching mechanism 320_3 communicate with the exhaust introduction unit 310 and the outside air intake ports 323 of the remaining switching mechanisms 320_1 and 320_2 communicate with the outside air introduction unit 330. As a result, while the organic-based exhaust flows into the individual exhaust pipe 123, the outside air flows into the remaining individual exhaust pipes 121 and 122. At this time, the outside air contains the atmosphere around the supply line of the processing fluid drawn through the exhaust port 501a.

In this case, for example, when switching the type of the processing liquid used in the processing unit 16 to the organic-based processing liquid, IPA during the transition from the rinsing processing (to be described later) to the drying processing, the control unit 18 controls the FFU 21 to change the type of the gas supplied to the processing unit 16, for example, from the clean air to the low dew-point gas having a lower humidity or oxygen concentration than the clean air, such as, for example, clean dry air (CDA).

Next, a more specific configuration of the FFU 21 including the supply line of the low dew-point gas will be described with reference to FIGS. 9A to 9D.

Figure 9A:
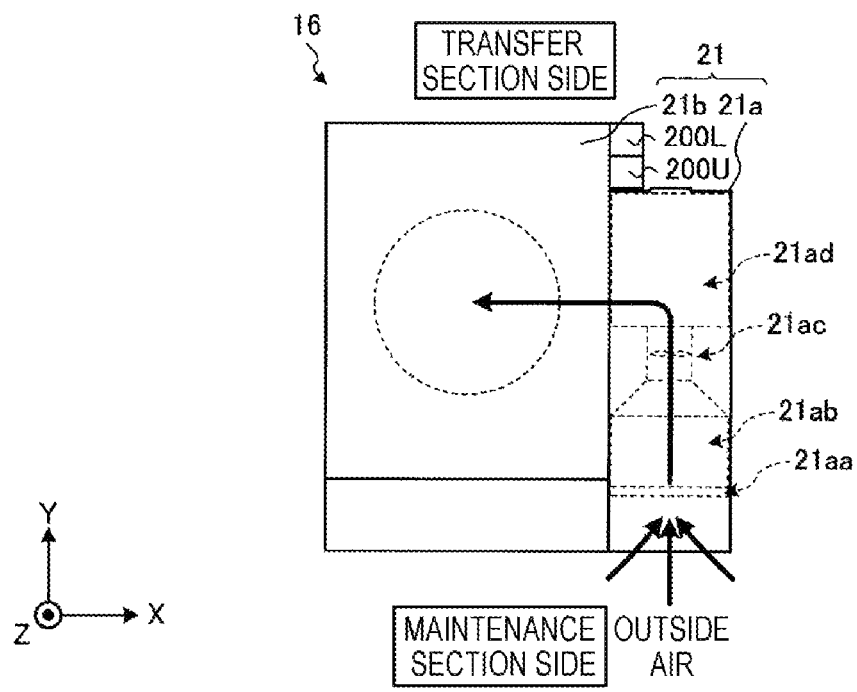
FIG. 9A is a schematic plan view of the processing unit.
Figure 9B:
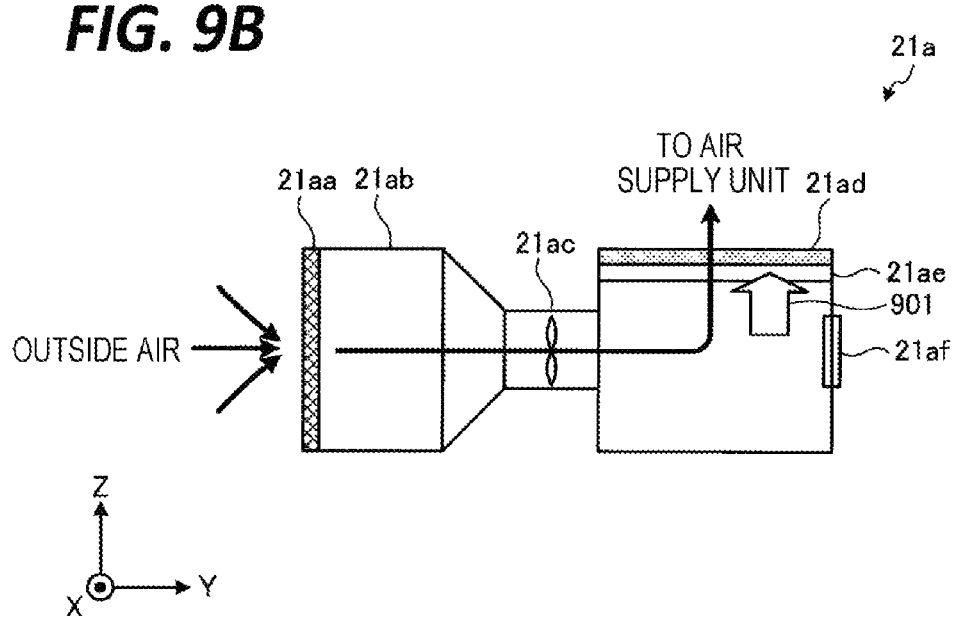
FIG. 9B is a schematic view illustrating a configuration of an intake unit.
Figure 9C:
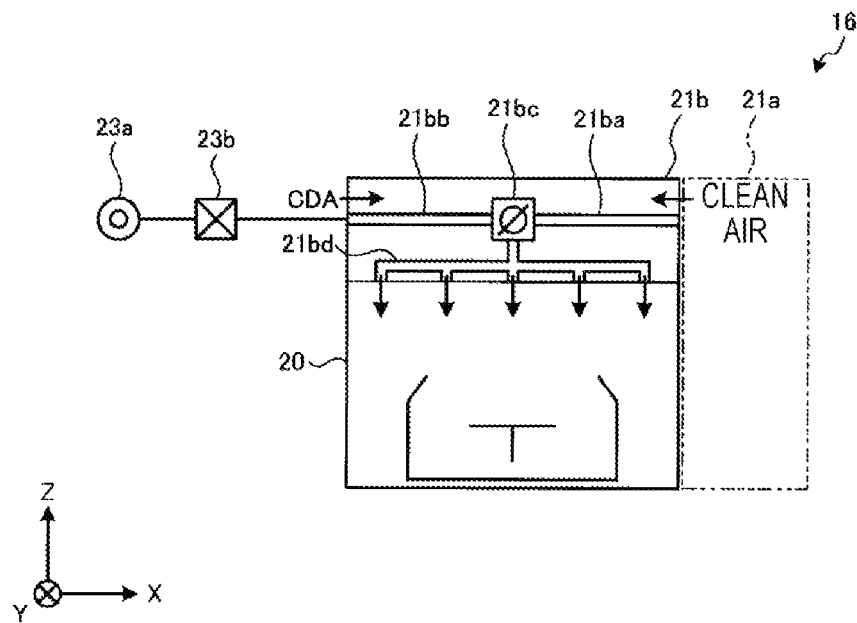
FIG. 9C is a schematic view illustrating a configuration of an air supply unit.

FIG. 9A is a schematic plan view of the processing unit 16. FIG. 9B is a schematic view illustrating a configuration of the intake unit 21a. FIG. 9C is a schematic view illustrating a configuration of the air supply unit 21b. FIG. 9B is a schematic view illustrating a configuration of the intake unit 21a.

Meanwhile, since FIG. 9A corresponds to FIG. 6D, the points explained with respect to FIG. 6D are omitted. As illustrated in FIG. 9A, the intake unit 21a includes a first filter 21aa, a guide unit 21ab, a fan 21ac, and a second filter 21ad. Further, as illustrated in FIG. 9B, the intake unit 21a further includes a path switching unit 21ae and a damper 21af.

The first filter 21aa is, for example, an ultra-low penetration air (UPLA) filter which removes, for example, dirt and dust from the outside air so as to purify the outside air. The guide unit 21ab guides the clean air from the first filter 21aa toward the fan 21ac.

The fan 21ac receives the clean air. The second filter 21ad is, for example, a chemical filter which removes, for example, ammonia, acids, organic substances so as to further purify the air.

The second filter 21ad is attached to the path switching unit 21ae. The path switching unit 21ae is provided to be movable up and down. As indicated by an arrow 901, the path through which the clean air flows may be switched to the air supply unit 21b side at the time of ascending. The damper 21af is closed when the clean air is supplied to the air supply unit 21b. Meanwhile, the path switching unit 21ae and the damper 21af are controlled by the control unit 18.

Further, as illustrated in FIG. 9C, the air supply unit 21b includes a first air supply pipe 21ba, a second air supply pipe 21bb, an air supply switching valve 21bc, and an air supply port 21bd. One end of the first air supply pipe 21ba is connected to the intake unit 21a and the other end of the first air supply pipe 21ba is connected to the air supply switching valve 21bc so as to form an air supply path for the clean air.

One end of the second air supply pipe 21bb is connected to the supply line of the low dew-point gas through a valve 23b from a low dew-point gas supply source 23a, and the other end of the second air supply pipe 21bb is connected to the air supply switching valve 21bc so as to form an air supply path for the low dew-point gas such as, for example, CDA.

The air supply switching valve 21bc switches the types of the gas supplied toward the chamber 20 by the control of the control unit 18. That is, when it is required to supply the clean air, the second air supply pipe 21bb side is closed and the first air supply pipe 21ba side is opened, and when it is required to supply the low dew-point gas, the first air supply pipe 21ba side is closed and the second air supply pipe 21bb side is opened.

The air supply port 21bd has a plurality of air supply ports arranged substantially uniformly toward the chamber 20 and rectifies the clean air or the low dew-point gas flowing from the air supply switching valve 21bc through such air supply ports, while forming a downflow in the chamber 20.

Figure 9D:
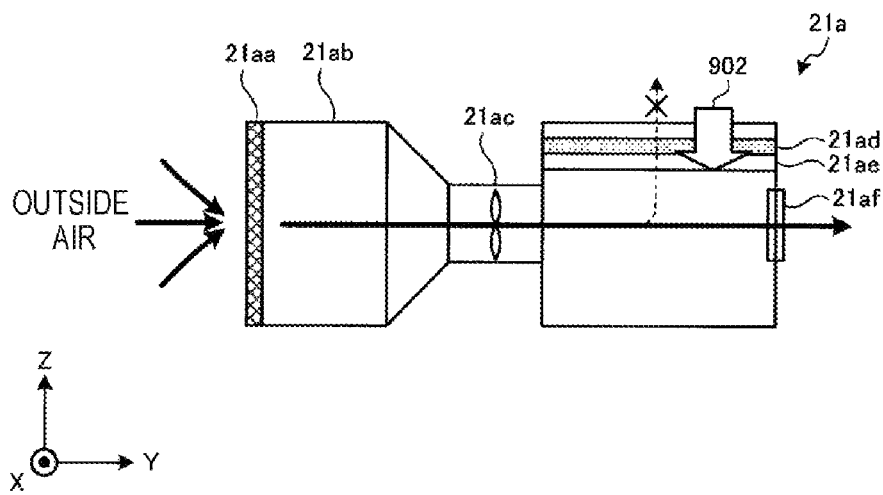
FIG. 9D is a schematic view illustrating the configuration of the intake unit.

Meanwhile, as illustrated by an arrow 902 in FIG. 9D, the path switching unit 21*ae* may block the flow of the clean air to the air supply unit 21*b* side at the time of descending. Further, at this time, the damper 21*af* is gradually opened and exhausts the clean air flowing through the fan 21*ac* to the outside. As a result, the pressure fluctuation when the type of the gas supplied is changed from the clean air to the low dew-point gas may be suppressed.

Figure 10:
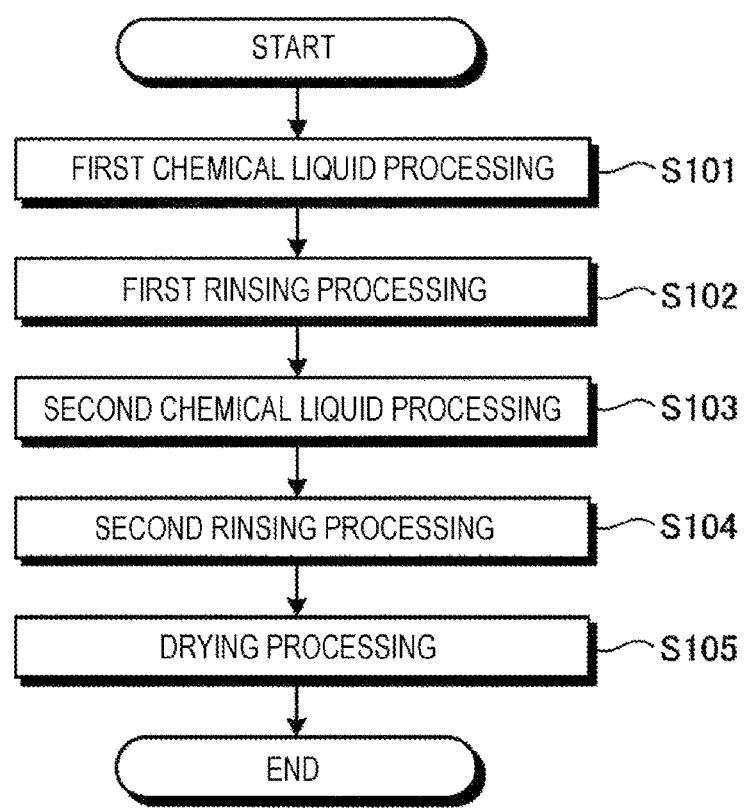
FIG. 10 is a flowchart illustrating an exemplary processing sequence of a substrate processing performed in the substrate processing system.

Next, an example of a substrate processing performed in the substrate processing system 1 according to the exemplary embodiment will be described with reference to FIG. 10. FIG. 10 is a flowchart illustrating an exemplary processing sequence of the substrate processing performed in the substrate processing system 1.

Meanwhile, a series of substrate processings illustrated in FIG. 10 are performed by controlling, for example, the processing unit 16 and the exhaust switching unit 300 by the control unit 18. The control unit 18 is, for example, a central processing unit which controls, for example, the processing unit 16 and the exhaust switching unit 300 according to the program (not illustrated) stored in the storage unit 19.

As illustrated in FIG. 10, a first chemical liquid processing is first performed in the processing unit 16. In the first chemical liquid processing, the driving unit 33 first rotates a holding unit 31, thereby rotating the wafer held in the holding unit 31 at a predetermined number of rotations. Subsequently, a nozzle 41 of a processing fluid supply unit 40 is located above the center of the wafer W. Thereafter, a valve 75 is opened for a predetermined time and SC1 supplied from the alkali-based processing liquid supply source 71 is supplied from the nozzle 41 to the processing target surface of the wafer W. The SC1 supplied to the wafer W is spread over the entire processing target surface of the wafer W by a centrifugal force attended by the rotation of the wafer W. As a result, the processing target surface of the wafer W is processed by the SC1.

While the first chemical liquid processing is performed, the alkali-based exhaust, which is an exhaust from the processing unit 16, is discharged from the first exhaust pipe 200 to the individual exhaust pipe 121 through the switching mechanism 320_1 of the exhaust switching unit 300. Further, the atmosphere around the supply line of the processing fluid flowing from the exhaust port 501*a* is taken as the outside air and discharged to the individual exhaust pipes 122 and 123.

Then, in the processing unit 16, a first rinsing processing is performed so that the processing target surface of the wafer W is washed by the DIW (step S102). In the first rinsing processing, the valve 78 is opened for a predetermined time, whereby the DIW supplied from the DIW supply source 74 is supplied from the nozzle 41 to the processing target surface of the wafer W and the SC1 remaining in the wafer W is washed. While the first rinsing processing is performed, the exhaust from the processing unit 16 is discharged to, for example, the individual exhaust pipe 121. Further, the atmosphere around the processing fluid supply lines, which flows from the exhaust port 501*a*, is taken as the outside air and discharged to the individual exhaust pipes 122 and 123.

Subsequently, a second chemical liquid processing is performed in the processing unit 16 (step S103). In the second chemical liquid processing, the valve 76 is opened for a predetermined time and HF supplied from the acid-based processing liquid supply source 72 is supplied from the nozzle 41 to the processing target surface of the wafer W. The HF supplied to the wafer W is spread over the entire processing target surface of the wafer W by a centrifugal force attended by the rotation of the wafer W. As a result, the processing target surface of the wafer W is processed by the HF.

Before the second chemical liquid processing is initiated, the control unit 18 controls the exhaust switching unit 300 to switch the outflow destination of the exhaust from the individual exhaust pipe 121 to the individual exhaust pipe 122. Thus, while the second chemical liquid processing is performed, the acid-based exhaust, which is an exhaust from the processing unit 16, is discharged from the first exhaust pipe 200 to the individual exhaust pipe 122 through the switching mechanism 320_2 of the exhaust switching unit 300. Further, the atmosphere around the processing fluid supply lines, which flows from the exhaust port 501*a*, is taken as the outside air and discharged to the individual exhaust pipes 121 and 123.

Subsequently, in the processing unit 16, a second rinsing processing is performed so that the processing target surface of the wafer W is washed by the DIW (step S104). In the second rinsing processing, the valve 78 is opened for a predetermined time, whereby the DIW supplied from the DIW supply source 74 is supplied from the nozzle 41 to the processing target surface of the wafer W and the HF remaining in the wafer W is washed. While the second rinsing processing is performed, the exhaust from the processing unit 16 is discharged to, for example, the individual exhaust pipe 122. Further, the atmosphere around the supply line of the processing fluid flowing from the exhaust port 501*a* is taken as the outside air and discharged to the individual exhaust pipes 121 and 123.

Subsequently, a drying processing is performed in the processing unit 16 (step S105). In the drying processing, the valve 77 is opened for a predetermined time and IPA supplied from the organic-based processing liquid supply source 73 is supplied from the nozzle 41 to the processing target surface of the wafer W. The IPA supplied to the wafer W is spread over the entire processing target surface of the wafer W by a centrifugal force attended by the rotation of the wafer W. Thus, the DIW remaining on the processing target surface of the wafer W is replaced with the IPA which is more volatile than the DIW. Thereafter, in the processing unit 16, the rotation speed of the wafer W is increased so that the IPA on the wafer W is shaken to dry the wafer W.

Before the drying processing is initiated, the control unit 18 controls the exhaust switching unit 300 to switch the outflow destination of the exhaust from the individual exhaust pipe 122 to the individual exhaust pipe 123. Thus, while the drying processing is performed, the organic-based exhaust, which is an exhaust gas from the processing unit 16, is discharged from the first exhaust pipe 200 to the individual exhaust pipe 123 through the switching mechanism 320_2 of the exhaust switching unit 300. Further, the atmosphere around the processing fluid supply lines, which flows from the exhaust port 501*a*, is taken as the outside air and discharged to the individual exhaust pipes 121 and 122.

In addition, the control unit 18 switches the type of the gas supplied from the FFU 21 from the clean air to the low dew-point gas before the drying processing is initiated. The control unit 18 also controls the damper 21*af* to exhaust the outside air taken in the intake unit 21*a* to the outside. Thus, even when the type of the gas supplied to the processing unit 16 is changed, the pressure fluctuation of the processing unit 16 may be suppressed.

Thereafter, in the processing unit 16, after the rotation of the wafer W by the driving unit 33 is stopped, the wafer W is carried out from the processing unit 16 by the substrate transfer device 17 (see, e.g., FIG. 1). Accordingly, a series of substrate processing steps for one wafer W are completed.

As described above, the substrate processing system 1 (corresponding to an example of the substrate processing apparatus) according to the present exemplary embodiment includes a plurality of processing units 16 and an FFU 21 (corresponding to an example of the gas supply unit).

The plurality of processing units 16 are stacked and arranged, and hold a wafer W (corresponding to an example of a substrate) in the chamber 20 so as to process the wafer W by a processing liquid. The FUU 21 is provided for each processing unit 16 and supplies a gas into the processing unit 16.

Further, the FFU 21 includes an intake unit 21a and an air supply unit 21b. The intake unit 21a takes in and purifies the outside air. The air supply unit 21b supplies the clean air purified by the intake unit 21a into the processing unit 16. Further, the intake unit 21a is arranged on a lateral side of the chambers 20 and arranged on the same side face of the chambers 20 between the stacked and arranged processing units 16.

Thus, with the substrate processing system 1 according to the exemplary embodiment, space saving may be further ensured.

Meanwhile, in the above-described exemplary embodiment, the horizontal pipes 104H are arranged to be positioned between the facing surfaces of the first beam section 402-1 and the second beam section 402-2 (see, e.g., FIG. 7F), but may not be completely positioned between the facing surfaces. That is, at least some of the horizontal pipes 104H may be included between the facing surfaces.

Similarly, in the above-described exemplary embodiment, the vertical pipes 104V are arranged so as to be positioned between the facing surfaces of the first column section 401-1 and the second column section 401-2 (see, e.g., FIG. 7C), but may not be completely positioned between the facing surfaces. That is, at least some of the vertical pipes 104V may be included between the facing surfaces.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a plurality of processing units stacked and arranged with each other, and each configured to hold a substrate in a chamber and to process the substrate by a processing liquid; and
a plurality of gas supply units provided for the plurality of processing units, respectively, to supply a gas into the plurality of processing units, respectively,
wherein each of the plurality of gas supply units includes:
an intake unit including a filter and configured to take in an outside air and purify the outside air into a clean air by the filter; and
an air supply unit arranged above the chamber so as to be opened at the chamber side, connected to the intake unit laterally so as to communicate with the intake unit, and configured to supply the clean air purified by the intake unit into the plurality of processing units,
wherein the intake unit is arranged on a lateral side of the chamber, and is arranged on same side face of each of chambers of the plurality of processing units.

2. The substrate processing apparatus of claim 1, further comprising a first exhaust pipe configured to guide exhaust from each of the plurality of processing units,
wherein the first exhaust pipe is arranged on the same side face as the intake unit with respect to the chambers, and vertically extends on the side face of the chambers.

3. The substrate processing apparatus of claim 2, further comprising a transfer section provided on a lateral side of the plurality of processing units at a position different from the side face on which the intake unit is arranged, and configured to transfer the substrate to the processing units,
wherein the first exhaust pipe and the intake unit are arranged in order from a side close to the transfer section.

4. The substrate processing apparatus of claim 3, wherein the intake unit includes an outside air intake port opened toward a side opposite to the side where the transfer section is disposed.

5. The substrate processing apparatus of claim 3, wherein the intake unit is arranged such that a space in which the first exhaust pipe is disposed is formed.

6. The substrate processing apparatus of claim 2, further comprising a second exhaust pipe configured to exhaust an atmosphere around a processing liquid supply system,
wherein the second exhaust pipe is arranged to pass through a lateral side opposite to the side face on which the intake unit is arranged or a lateral side of the intake unit, with respect to the chamber.

7. The substrate processing apparatus of claim 6, wherein the second exhaust pipe accommodates a pipe configured to supply the processing liquid into the processing units.

8. The substrate processing apparatus of claim 6, wherein the plurality of processing units are configured to be supplied with plural types of processing liquids,
the substrate processing apparatus further comprises a main exhaust pipe including a plurality of individual exhaust pipes each corresponding to at least one of the plural types of processing liquids, and an exhaust switching unit configured to switch an outflow destination of exhaust flowing in the first exhaust pipe to one of the individual exhaust pipes,
the exhaust switching unit is arranged above the stacked processing units, and
an exhaust port of the second exhaust pipe is connected to the exhaust switching unit.

9. The substrate processing apparatus of claim 8, wherein first exhaust pipes corresponding to processing units of an upper stage and first exhaust pipes corresponding to processing units of a lower stage, respectively, are connected through exhaust switching units, and
the main exhaust pipe is shared by the processing units of the upper stage and the processing units of the lower stage.

10. The substrate processing apparatus of claim 9, wherein the first exhaust pipes connected to the processing units of the upper stage and the first exhaust pipes connected to the processing units of the lower stage are arranged side by side behind a portion of the processing units.

11. The substrate processing apparatus of claim 9, wherein the exhaust switching units corresponding to the processing units of the upper stage and the exhaust switching units corresponding to the processing units of the lower stage are arranged in line symmetry about a center line of the first exhaust pipes such that the exhaust switching units face each other.

12. The substrate processing apparatus of claim 8, wherein while the exhaust flows into one of the individual exhaust pipes of the main exhaust pipe from the processing unit, the outside air flows into the remaining individual exhaust pipes of the main exhaust pipe, thereby suppressing pressure fluctuation of the processing unit due to fluctuation of flow rate.

13. The substrate processing apparatus of claim 1, further comprising:
   a controller configured to control the plurality of gas supply units to change a type of the gas supplied to the plurality of processing units from the clean air to a low dew-point gas having a lower humidity or oxygen concentration than the clean air upon transition from a rinsing processing to a drying processing.

* * * * *